(12) United States Patent
Wan et al.

(10) Patent No.: US 8,491,962 B2
(45) Date of Patent: Jul. 23, 2013

(54) METHOD FOR MANUFACTURING A LOW-K LAYER

(75) Inventors: Ben-Zu Wan, Taipei (TW); Hsin-Yan Lu, Taipei (TW)

(73) Assignee: National Taiwan University, Taipei (TW)

( * ) Notice: Subject to any disclaimer, the term of this patent is extended or adjusted under 35 U.S.C. 154(b) by 293 days.

(21) Appl. No.: 12/753,109

(22) Filed: Apr. 2, 2010

(65) Prior Publication Data

US 2011/0239902 A1    Oct. 6, 2011

(51) Int. Cl.
*B05D 5/12*    (2006.01)
*B05D 3/02*    (2006.01)

(52) U.S. Cl.
USPC ......... 427/240; 427/337; 427/387; 427/397.7

(58) Field of Classification Search
USPC ................. 427/240, 384, 387, 397.7, 337
See application file for complete search history.

(56) References Cited

U.S. PATENT DOCUMENTS 7,384,622 B2    6/2008    Hata et al.
7,709,551 B2 *  5/2010    Kang et al. .................. 522/83

OTHER PUBLICATIONS

Cho et al., Thin Solid Films, 483, 283-286, 2005.
Ha et al., Ceram. Int., 34, 947-951, 2008.
Tsai et al., Thin Solid Films, 517, 2039-2043, 2009.
Li et al., Adv. Funct. Mater., 14, 1019-1024, 2004.

* cited by examiner

*Primary Examiner* — Kirsten Jolley
(74) *Attorney, Agent, or Firm* — CKC & Partners Co., Ltd.

(57) ABSTRACT

Discloses herein is a method of forming a low-k layer. The method includes the following steps. Tetraalkoxysilane, ethanol, tetraalkylammonium hydroxide and water are mixed in a molar ratio between 1:0.1:0.1:5 and 1:10:0.5:36 to form a first mixture. The first mixture is heated for a period of less than about 36 hours to form a second mixture containing a plurality of non-crystalline silicon-containing particles, wherein each of the non-crystalline silicon-containing particles has a particle size of smaller than about 10 nm. Subsequently, a surfactant is added to the second mixture to form a colloid solution, in which the surfactant has a concentration of about 1-20% by weight of the colloid solution. The colloid solution is coated on a substrate and thereby forming a colloid layer thereon. Then, the colloid layer is heated at a condition sufficient to transform the colloid layer into the low-k layer.

15 Claims, 2 Drawing Sheets

METHOD FOR MANUFACTURING A LOW-K LAYER

BACKGROUND

1. Field of Invention

The present disclosure relates to low-k dielectrics. More particularly, the present disclosure relates to a non-crystalline dielectric layer having a dielectric constant of less than 2.

2. Description of Related Art

Nowadays a semiconductor device is highly integrated, and as the clearance between the metal wiring layers of the semiconductor device becomes smaller, the parasitic capacitance between the metal wirings becomes larger, which may lead to some disadvantages such as a delay in a response speed or an increase in the power consumption. To overcome these problems, a low-k dielectric of less than 2 is required to decrease the parasitic capacitance between the metal wirings.

The low-k dielectric also needs to possess sufficient hardness and high elastic modulus, so as to endure the process conditions during the manufacturing process. In general, it requires a hardness of greater than 1 GPa and an elastic modulus of greater than 10 GPa.

Cho et al. disclosed a dielectric layer having a dielectric constant of 1.95, hardness of 1.1 GPa and an elastic modulus of 17.7 GPa (Thin Solid Films, 483, 283-286, 2005). A post-treatment using ozone was employed in this technology to improve the properties of dielectric layer. However, it requires application of an ozone gas at a high temperature of 300° C., and thus leading to a safety concern.

Another method of forming a low-k dielectrics has been reported by Ha et al. (Ceram. Int., 34, 947-951, 2008). In this technology, tetraethylorthosilicate (TEOS) and Methyltriethoxysilane (MTES) are used as silicate sources, and the dielectric constant of the low-k dielectrics is 2.32, which is still greater than 2.

Tsai et al. provided a method of forming a dielectric layer as well (Thin Solid Films, 517, 2039-2043, 2009). In this research, the dielectric constant and elastic modulus exhibit a trade-off. A dielectric constant of less than 2 and modulus of elasticity of greater than 10 GPa may not simultaneously be satisfied.

U.S. Pat. No. 7,384,622 disclosed a dielectric layer having a zeolite structure. This technology exhibits a satisfactory result in the both the dielectric constant and modulus of elasticity. However, it requires a long period of time of 5-7 days to complete the whole process.

In view of the above, there exists in this art a need of an improved method for forming a low-k layer, which would resolve the above mentioned issues.

SUMMARY

According to one aspect of the present disclosure, a method of forming a low-k layer is disclosed. The method comprises the following steps. Tetraalkoxysilane, ethanol, tetraalkylammonium hydroxide and water are mixed in a molar ratio between 1:0.1:0.1:5 and 1:10:0.5:36 to form a first mixture. The first mixture is heated for a period of less than about 36 hours to form a second mixture containing a plurality of non-crystalline silicon-containing particles, wherein each of the non-crystalline silicon-containing particles has a particle size of smaller than about 10 nm. Subsequently, a surfactant is added to the second mixture to form a colloid solution, in which the surfactant has a concentration of about 1-20% by weight of the colloid solution. The colloid solution is coated on a substrate and thereby forming a colloid layer thereon. Then, the colloid layer is heated at a condition sufficient to transform the colloid layer into the low-k layer.

According to another aspect of the present disclosure, a low-k layer is provided. The low-k layer is made by the method described above and is characterized in having a dielectric constant of less than 2, and without a zeolite structure therein.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
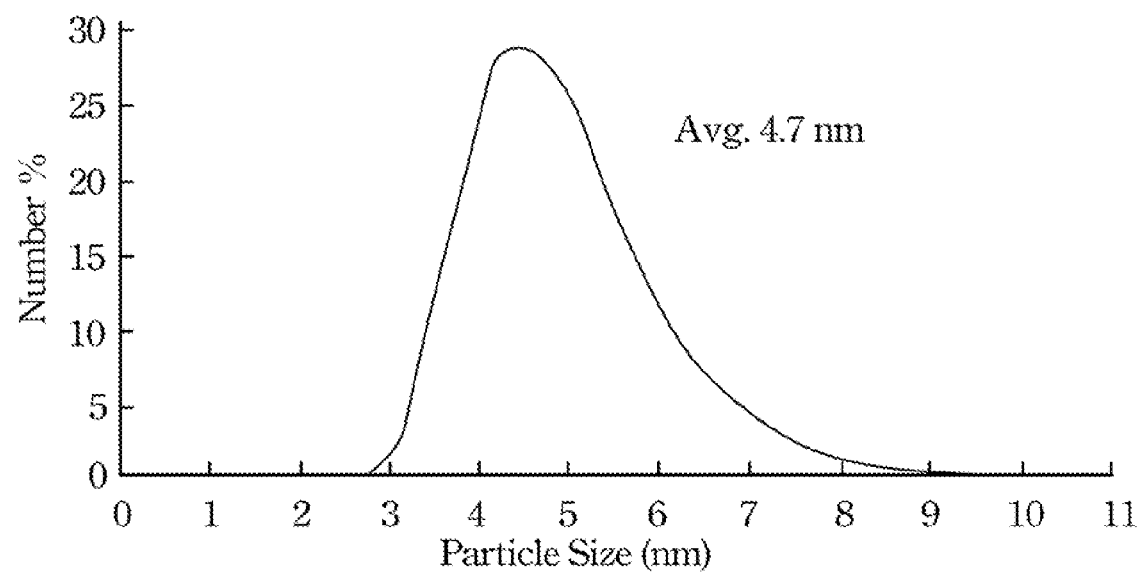
FIG. 1 illustrates a particle size distribution of the silicon-containing particles according to one embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details.

According to one aspect of the present disclosure, a method of forming a low-k layer is disclosed. The method comprises the steps of:

(a) mixing tetraalkoxysilane, ethanol, tetraalkylammonium hydroxide and water in a molar ratio between 1:0.1:0.1:5 and 1:10:0.5:36 to form a first mixture;

(b) heating the first mixture for a period of less than about 36 hours to form a second mixture containing a plurality of non-crystalline silicon-containing particles, wherein each of the non-crystalline silicon-containing particles has a particle size of smaller than about 10 nm;

(c) adding a surfactant to the second mixture to form a colloid solution, wherein the surfactant has a concentration of about 1-20% by weight of the colloid solution;

(d) coating the substrate with the colloid solution and thereby forming a colloid layer thereon; and (e) heating the colloid layer at a condition sufficient to transforming the colloid layer into the low-k layer.

In the step (a), the tetraalkoxysilane, ethanol, tetraalkylammonium hydroxide and water are mixed in a molar ratio of 1 (tetraalkoxysilane):0.1-10 (ethanol): 0.1-0.5 (tetraalkylammonium hydroxide): 5-36 (water) to form the first mixture. Particularly, the molar ratio may be between 1:4:0.3:8 and 1:10:0.4:16. In one example, the mixture of tetraalkoxysilane, ethanol, tetraalkylammonium hydroxide and water are mixed and stirred at a temperature of about 20-40° C. for a period of about 1-12 hours, specifically 2-5 hours, more specifically about 3 hours. In another example, the tetraalkoxysilane may be tetraethylorthosilicate (TEOS) or tetramethylorthosilicate (TMOS). In still another example, the tetraalkylammonium hydroxide of the step (a) may be tetrapropyl ammonium hydroxide (TPAOH) or tetraethyl ammonium hydroxide (TEAOH).

In the step (b), the first mixture obtained from the step (a) is heated for a period of less than about 36 hours to form a second mixture containing a plurality of non-crystalline silicon-containing particles therein, in which each of the non-crystalline silicon-containing particles has a particle size of smaller than about 10 nm. In some examples, the first mixture may be heated at a temperature of about 80-200° C. for about 4-36 hours by a hydrothermal method. For instance, the first mixture may be heated in an autoclave at 150° C. for 24 hours.

In the step (c), a surfactant is added to the second mixture obtained from the step (b), and thus forms a colloid solution. The concentration of the surfactant in the colloid solution may be in the range of about 1% to about 20%, specifically about 3-12%, more specifically about 5-10% by weight of the colloid solution. In one embodiment, the surfactant comprises a polymer surfactant. For example, a surfactant such as TWEEN 80™ (polyoxyethylene sorbitan monolaurate) may be employed.

In the step (d), the colloid solution is coated on a substrate and thereby forming a colloid layer thereon. The colloid solution can be coated on the substrate by any known method, such as spin, dip, spray, micro-gravure, and web tension coating.

In the step (e), the colloid layer is heated at a condition sufficient to transform the colloid, layer into the low-k layer. In one embodiment, the heating step comprises a step of subjecting the colloid layer to an environment at a temperature of about 20-200° C. for a period of about 0.5-5 hours to remove the water and ethanol from the colloid layer. In one example, the substrate having the colloid layer thereon is placed into an oven at a temperature of 100-200° C., for example 150° C., for 1 hour although other drying methods such as vacuum drying may be employed as well. In another embodiment, the heating step comprises a step of calcining the colloid layer at a temperature of about 400-600° C. in the presence of air for about 1-10 hours. For example, the calcination may be performed at 550° C. in a furnace for 5 hours to remove the organics such as tetraalkylammonium hydroxide and the surfactant in the colloid layer. After the calcination, the colloid layer is converted to the low-k layer having mesopores, each pore has a size in the range of about 2-50 nm. In some examples, the low-k layer has a thickness of less than 500 nm. In particular, the thickness of the low-k layer is in the range of about 150-350 nm.

In one embodiment, the method described above may further comprise a step of modifying the surface of the low-k layer to be hydrophobic. For instance, the surface modification may be performed by contacting the low-k layer with a solution comprising hexamethyldisilane and toluene in a volume ratio of about 2:1 at a temperature of 80° C. for 30-150 minutes. The hydrophobic surface of the low-k layer may prevent the water in the air from being adsorbed onto the low-k layer. And thus, the dielectric constant of the low-k layer would not be adversely affected by water, which has a dielectric constant of 78.

In another embodiment, the method may further comprise a step of adding a solvent to the second mixture prior to the step (c) or adding a solvent to the colloid solution after or at the same time of step (c). The solvent added may adjust the content of the non-crystalline silicon-containing particles and/or the surfactant in the colloid solution, and thus the thickness and porosity of the low-k layer may be adjusted as well. In examples, the solvent may be an alcohol such as ethanol or methanol.

According to another aspect of the present disclosure, a low-k layer is provided. The low-k layer is characterized in having a dielectric constant of less than 2, without a zeolite structure therein, and is made by the method described above. In examples, the low-k layer has a hardness of greater than 1 GPa and a modulus of elasticity of greater than 10 GPa.

EXAMPLES

The following Examples are provided to illustrate certain aspects of the present invention and to aid those of skill in the art in practicing this invention. These Examples are in no way to be considered to limit the scope of the invention in any manner.

Example 1

1.1 Forming Solution Comprising Non-Crystalline Silicon-Containing Particles

TEOS, ethanol, TPAOH and water in a molar ratio of 1:5.6:0.36:12.2 were mixed and stirred at a temperature of 30° C. for 3 hours, and followed by a hydrothermal reaction in an autoclave at a temperature of 100° C. for 24 hours.

The resulting solution after the hydrothermal reaction was analyzed by dynamic light scattering (DLS; Nano-ZS from Malvem, 4 mW He—Ne laser at 173 scattering angle) to determine the particle size of the silicon-containing particles in the resulting solution. FIG. 1 illustrates a particle size distribution associated with the resulting solution, and the particle size for most of the silicon-containing particles therein is smaller than about 10 nm, with an averaged value of about 4.7 nm.

1.2 Preparing Colloid Solution

After the hydrothermal reaction, the resulting solution was cooled to a room temperature, and 10 g of the resulting solution of EXAMPLE 1.1, 4.29 g of ethanol and 1.12 g of TWEEN 80™ surfactant were mixed and stirred for 3 hours at 30° C. to form a colloid solution. In this example, the concentration of the TWEEN$^{80TM}$ surfactant is of about 7.3% by weight of the colloid solution.

1.3 Forming The Low-k Layer

The colloid solution of EXAMPLE 1.2 was coated on a silicon wafer by spin coating. Then, the layer of the colloid solution was baked at 150° C. for 1 hour to remove the water and ethanol, and thus forming a cured colloid layer on the silicon wafer. Subsequently, the cured colloid layer was calcined in a furnace at 450° C. for 5 hours in the presence of air so that the colloid layer was converted into the low-k layer. Then, the wafer having the low-k layer was immersed in a hexamethyldisilane (HMDS) solution (HMDS/toluene=2:1 in volume) at 80° C. for 1.5 hours. In this example, the low-k layer has a thickness of about 310 nm, and a dielectric constant of about 1.99.

Figure 2:
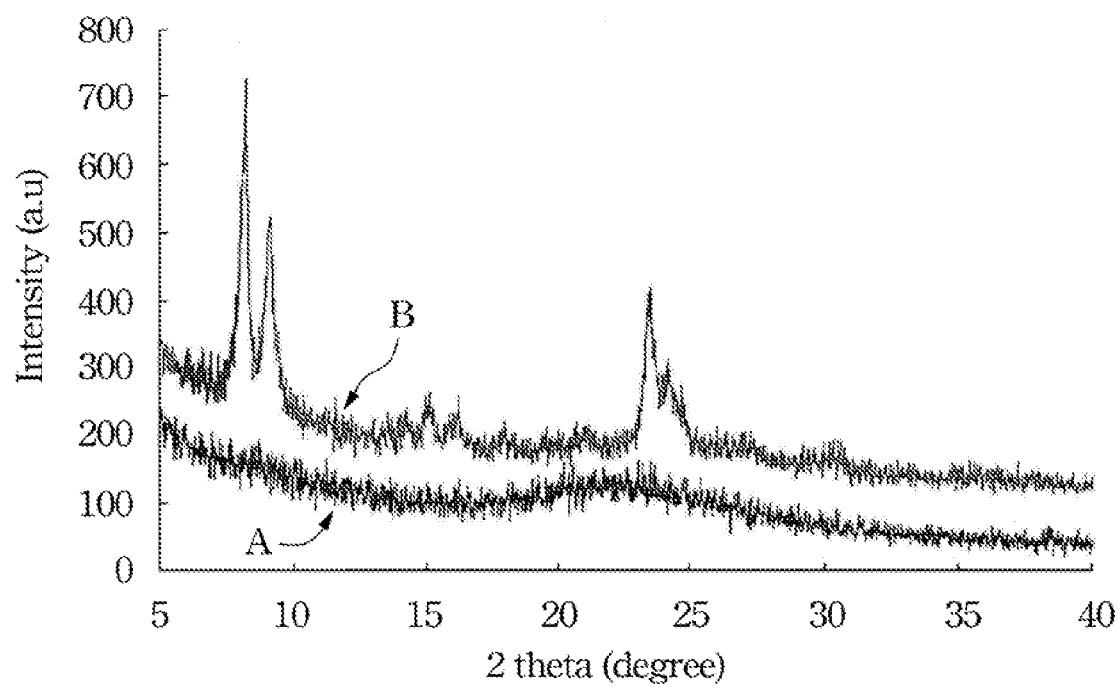
FIG. 2 illustrates X-ray diffraction patterns of the low-k layer according to one embodiment of the present disclosure.

FIG. 2 illustrates X-ray diffraction (XRD) patterns of the low-k layer measured by diffractometer (X-ray powder diffraction, X' Pert PRO, PANalytical). Referring to FIG. 2, curve A is the XRD pattern of the low-k layer of EXAMPLE 1.3. No apparent peak occurs in curve A, which indicates that the low-k layer is non-crystalline. Accordingly, it also suggests that the silicon-containing particles in the colloid solution of EXAMPLE 1.1 are also non-crystalline. In contrast, curve B illustrates the XRD pattern of another dielectric layer made by the same method except that the hydrothermal reaction in EXAMPLE 1.1 was carried out for 48 hours. Obviously, curve B exhibits strong peaks, and suggest a crystalline or zeolite structure existed in this dielectric layer.

Figure 3:
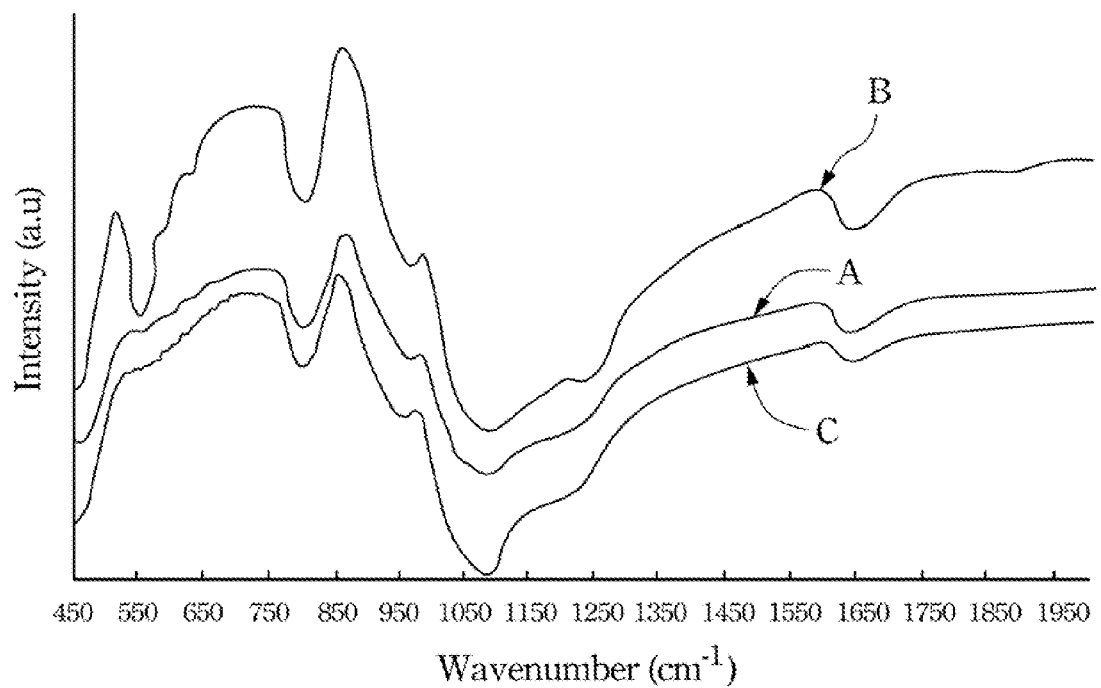
FIG. 3 illustrates FT-IR spectra of the low-k layer according to one embodiment of the present disclosure.

FIG. 3 illustrates FT-IR spectra of the low-k layer measured by spectrometer (Spectrum 100 Model FT-IR Spectrometer, PerkinElmer). Referring to FIG. 3, curve A is the spectrum of the low-k layer made from EXAMPLE 1.3, and no absorption is found at wavenumber of 550 cm$^{-1}$. The result reveals that the low-k layer does not possess a zeolite structure. Curve B represents the spectrum of another dielectric layer made by the same method except that the hydrothermal reaction in EXAMPLE 1.1 was carried out for 48 hours. Curve B shows a strong absorption at wavenumber of 550 cm$^{-1}$ which indicates the existence of a zeolite structure in this dielectric layer. Curve C depicts the spectrum of still another dielectric layer made by the same method except that the hydrothermal reaction in EXAMPLE 1.1 was omitted. Curve C gives a similar result as presented by Curve A, where no absorption is found at the wavenumber of 550 cm$^{-1}$.

Example 2

In this example, the low-k layer was prepared by the same method as described in EXAMPLE 1, except that the colloid solution was prepared by mixing 10 g ethanol, 1.12 g TWEEN 80™ surfactant and 10 g of the solution of EXAMPLE 1.1. In this example, the concentration of the TWEEN 80™ surfactant is of about 5.3% by weight of the colloid solution. The dielectric layer had a thickness of 201 nm, and a dielectric constant of 1.91, as shown in Table 1.

Example 3

In this example, the low-k layer was prepared by the same method as described in EXAMPLE 1, except that the colloid solution was prepared by mixing 6.67 g ethanol, 1.78 g TWEEN 80™ surfactant and 10 g of the solution of EXAMPLE 1.1. In this example, the concentration of the TWEEN 80™ surfactant is about 9.6% by weight of the colloid solution. The dielectric layer has a thickness of 228 nm, and a dielectric constant of 1.84.

Comparative Example

In this comparative example, the dielectric layer was prepared by a method provided by Li et al. (Adv. Funct. Mater., 14, 1019-1024, 2004). Tetraethylorthosilicate, ethanol, tetrapropyl ammonium hydroxide and water in a molar ratio of 1:5.6:0.36:12.2 were mixed and stirred at 30° C. for 3 days. The clear solution thus obtained was under a hydrothermal reaction in an autoclave at 60° C. for 2 days, and at 100° C. for another 2 days. The particles suspended in the resulting solution had an averaged particle size of about 60 nm according to a DSL analysis. Subsequently, 10 g of the resulting solution and 0.56 g of TWEEN 80™ surfactant were mixed and stirred for 3 hours at 30° C., and thus forming a colloid solution. The colloid solution was centrifuged for 24 hours to separate the larger particles from the colloid solution. After the centrifugation, the averaged particle size of the particles suspending in the colloid solution was about 40 nm. Then, the colloid solution was coated onto a silicon wafer by spin coating and baked at 150° C. for 1 hour. Subsequently, calcination was performed at 450° C. for 5 hours under air, and thus a dielectric layer was formed on the silicon wafer. A surface modification process was also carried out by immersing the dielectric layer in a HMDS solution at 80° C.

Characterization of the Low-k Layer of Example 1, 2, 3 and Comparative Example

The hardness and elastic modulus of the low-k layers of EXAMPLE 1, 2, 3 and comparative example were measured independently, and the results are summarized in Table 1.

TABLE 1

| | Thickness (nm) | Dielectric Constant | Hardness (GPa) | Modulus of Elasticity (GPa) |
|---|---|---|---|---|
| EXAMPLE 1 | 310 | 1.99 | 1.46 | 13.6 |
| EXAMPLE 2 | 201 | 1.91 | 1.96 | 18.9 |
| EXAMPLE 3 | 228 | 1.84 | 1.73 | 14.6 |
| COMPARATIVE EXAMPLE | | | 0.37 | 5.41 |

All of the low-k layers in EXAMPLE 1, 2 and 3 exhibit not only a dielectric constant of less than 2, but also a hardness greater than 1 GPa and an elastic modulus of greater than 10 GPa. As a result, the dielectric layer according to the present disclosure may be practically applied in semiconductor device. As to the low-k layer of comparative example, it has a hardness of only 0.37 GPa, and an elastic modulus of only 5.41 GPa, as shown in Table 1.

Figure 4:
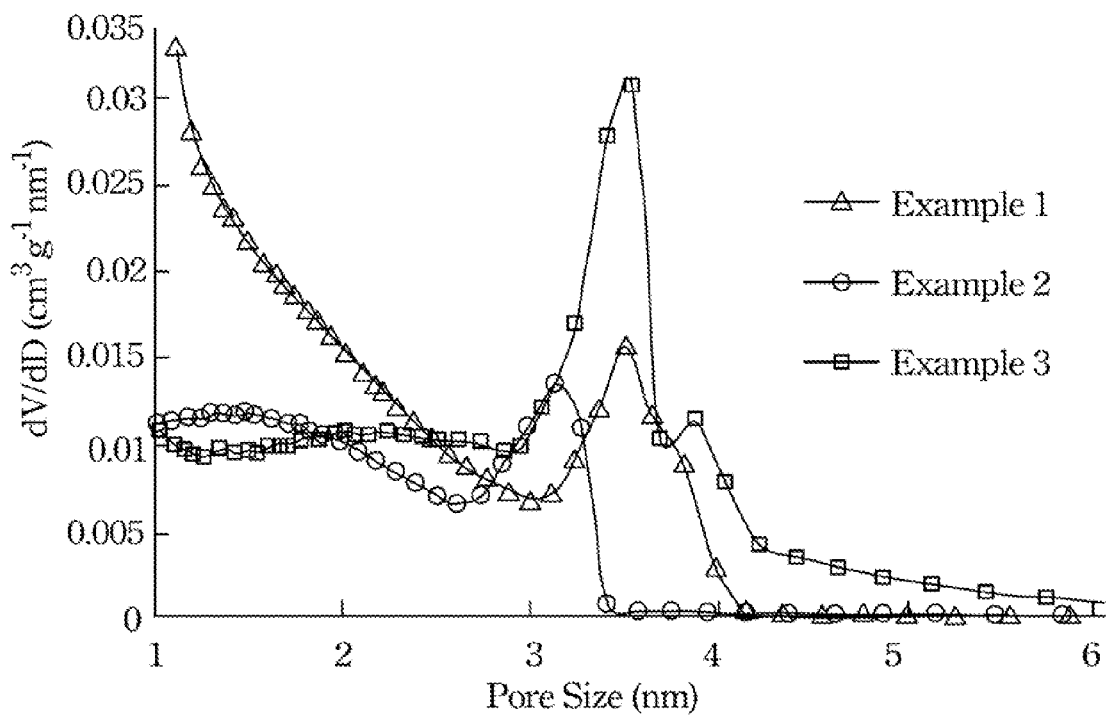
FIG. 4 depicts the pore size distributions of low-k dielectrics according to EXAMPLE 1, 2 and 3 of the present disclosure.

FIG. 4 depicts the pore size distributions of low-k dielectrics according to EXAMPLE 1, 2 and 3. All of the dielectric materials according to EXAMPLE 1, 2 and 3 have mesopores, more specifically ranged from 2.8 nm to 6 nm.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method of forming, a low-k layer on a substrate, comprising:
    (a) mixing tetraalkoxysilane, ethanol, tetraalkylammonium hydroxide and water in a molar ratio between 1:4:0.3:8 and 1:10:0.4:16 to form a first mixture;
    (b) heating the first mixture for a period of less than about 36 hours to form a second mixture containing a plurality of non-crystalline silicon-containing particles, wherein each of the non-crystalline silicon-containing particles has a particle size of smaller than about 10 nm;
    (c) adding a surfactant to the second mixture to form a colloid solution, wherein the surfactant has a concentration of about 1-20% by weight of the colloid solution;
    (d) coating the substrate with the colloid solution and thereby forming a colloid layer thereon; and
    (e) calcining the colloid layer at a temperature of about 400-600° C. in the presence of air to transforming the colloid layer into the low-k layer, wherein the low-k layer has a dielectric constant of less than 2.

2. The method of claim 1, further comprising a step (f) of modifying the surface of the low-k layer to be hydrophobic.

3. The method of claim 2, wherein the step (f) comprises contacting the low-k layer with a hexamethyldisilane solution.

4. The method of claim 1, further comprising a step of adding a solvent to the second mixture or the colloid solution prior to, after or at the same time of step (c).

5. The method of claim 4, wherein the solvent comprises ethanol.

6. The method of claim 1, wherein the step (a) is performed at a temperature of about 20-40° C. for a period of about 1-12 hours.

7. The method of claim 1, wherein the tetraalkoxysilane of the step (a) is tetraethylorthosilicate.

8. The method of claim 1, wherein the tetraalkylammonium hydroxide of the step (a) is tetrapropyl ammonium hydroxide.

9. The method of claim 1, wherein the step (b) comprises heating the first mixture at a temperature of about 80-200° C. for a period of about 4-36 hours by a hydrothermal method.

10. The method of claim 1, wherein the step (d) is performed by spin-coating.

11. The method of claim 1, wherein the step (e) comprises subjecting the colloid layer to an environment at a temperature of about 20-200° C. for a period of about 0.5-5 hours to remove the water and ethanol from the colloid layer.

12. The method of claim 1, wherein the concentration of the surfactant in step (c) is about 3-12% by weight of the colloid solution.

13. The method of claim 12, wherein the surfactant comprises TWEEN 80™.

14. The method of claim 1, wherein the low-k layer has a thickness of less than 500 nm.

15. The method of claim 14, wherein the thickness of the low-k layer is about 150-350 nm.

* * * * *